United States Patent [19]

Poujois

[11] Patent Number: 4,965,578

[45] Date of Patent: Oct. 23, 1990

[54] HIGH DYNAMIC ANALOG TO DIGITAL COUNTER

[75] Inventor: Robert Poujois, Sinard, France

[73] Assignee: Commissariat a l'Energie Atomique, France

[21] Appl. No.: 257,051

[22] Filed: Oct. 13, 1988

[30] Foreign Application Priority Data

Oct. 21, 1987 [FR] France .................. 87 14535

[51] Int. Cl.⁵ .......................... H03M 1/60
[52] U.S. Cl. .................. 341/156; 341/157; 341/166
[58] Field of Search .......... 341/128, 156, 164, 169, 341/170, 155, 172

[56] References Cited

U.S. PATENT DOCUMENTS

| | | | |
|---|---|---|---|
| 3,684,048 | 8/1972 | Pincus | 341/169 |
| 3,765,012 | 10/1973 | Grutzediek et al. | 341/164 |
| 3,772,683 | 11/1973 | Dorey | 341/156 |
| 3,906,486 | 9/1975 | Phillips | 341/128 |
| 3,958,236 | 5/1976 | Kelly | 341/128 |
| 4,065,766 | 12/1977 | Butler et al. | 341/172 |
| 4,156,233 | 5/1979 | Puckette et al. | 341/172 |
| 4,178,585 | 12/1979 | Takagi et al. | 341/172 |
| 4,528,549 | 7/1985 | Simpson | 341/164 |
| 4,544,918 | 10/1985 | DeHaan | 341/164 |

OTHER PUBLICATIONS

Patent Abstracts of Japan, 25.2.1984, vol. 8, No. 44.
Patent Abstracts of Japan 6.8.1983, vol. 7, No. 178.

Primary Examiner—William M. Shoop, Jr.
Assistant Examiner—Brian Young
Attorney, Agent, or Firm—Hayes, Soloway, Hennessey & Hage

[57] ABSTRACT

An analog to digital converter comprises coarse (15, 16) and fine (24, 19) quantization. The coarse quantization is of the frequency-current type or frequency-voltage frequency type. The fine quantization measures the discharge period of a residual charge stored in an integration capacitor (3) at the end of the coarse quantization phase. The discharger of this capacitor includes a capacitor (14) for quantifying this discharge.

10 Claims, 3 Drawing Sheets

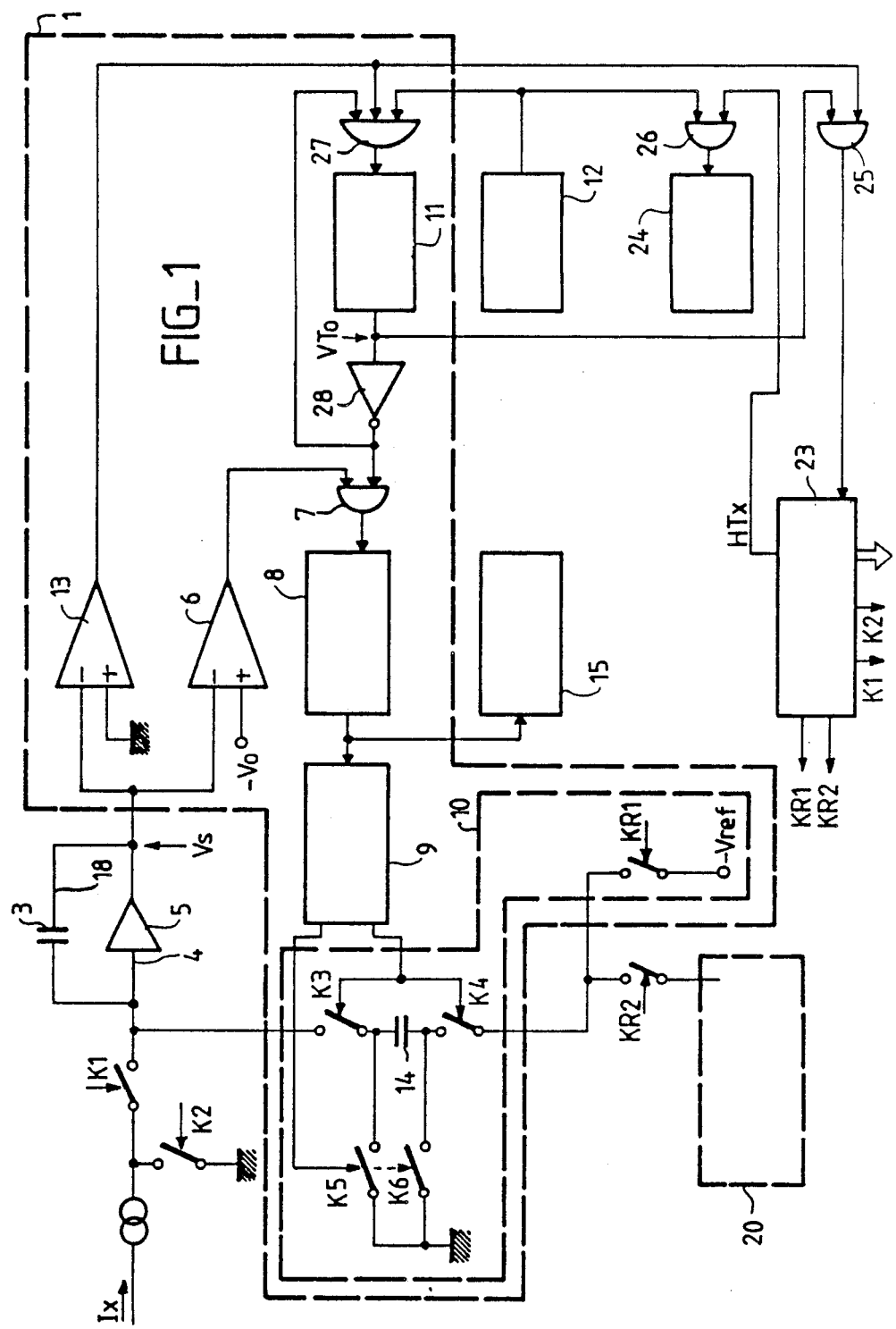

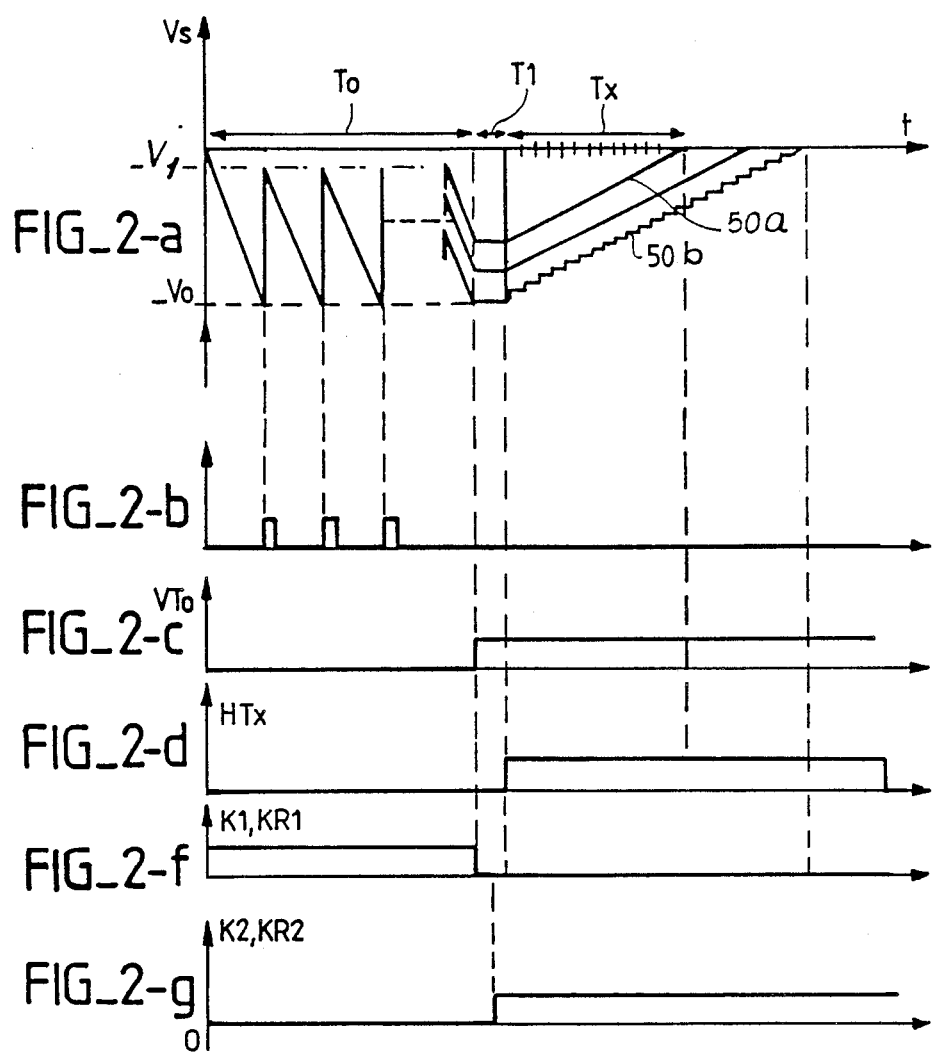

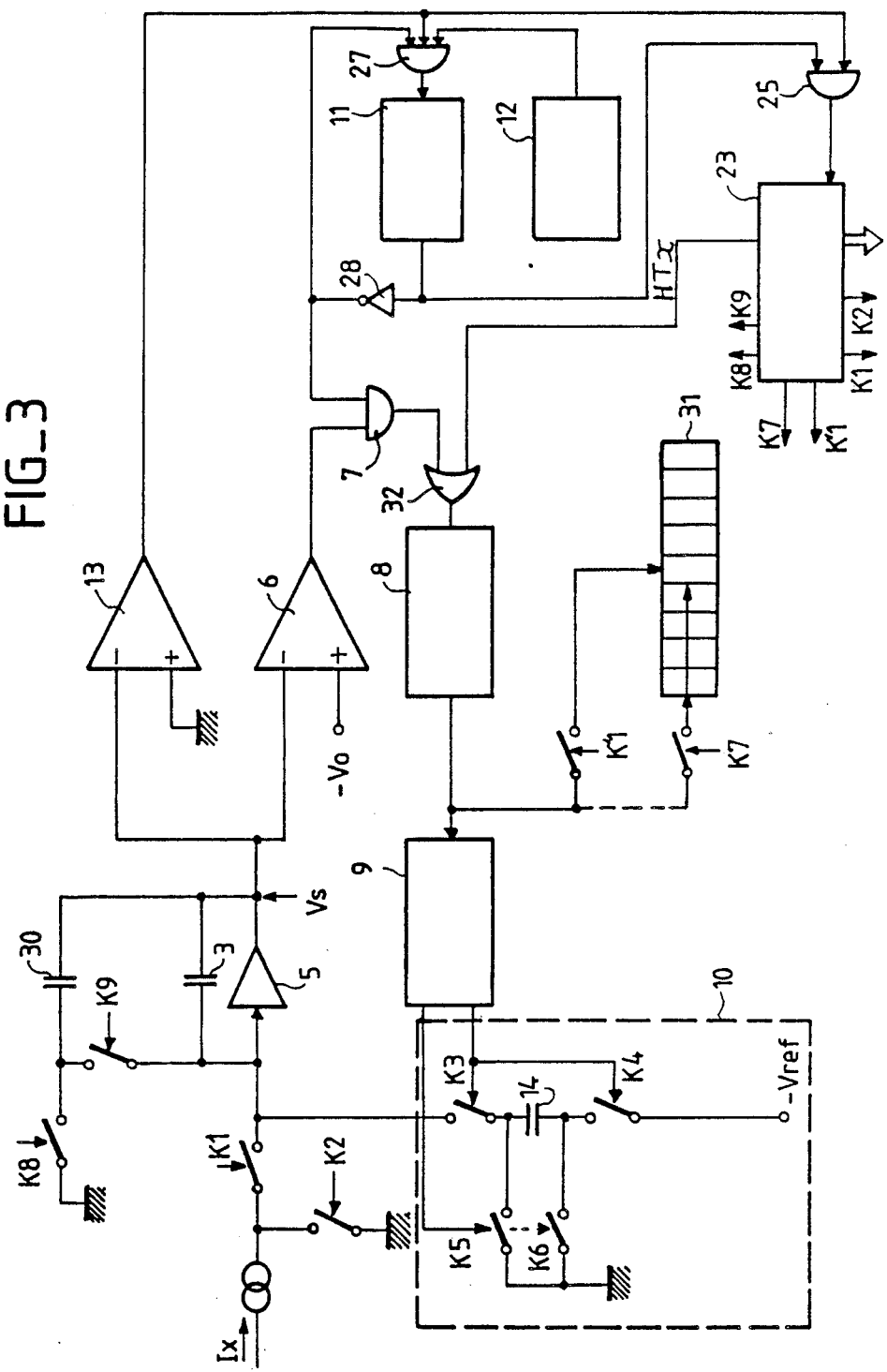
FIG_3

4,965,578

HIGH DYNAMIC ANALOG TO DIGITAL COUNTER

FIELD OF THE INVENTION

The present invention relates to a high dynamic analog to digital converter. This converter can be used in all conversion applications. In particular, it can be used in tomodensitometers so as to obtain a digital measurement of the current leaving the ionization chambers of an X-ray detector. This converter may nevertheless be used in other spheres, especially when the signals to be converted are low-current electric signals or when several parallel signals require to be measured simultaneously, or even when the MOS technological integration of this converter proves necessary.

BACKGROUND OF THE INVENTION

As regards the state of the technique, the converters are of the following types. Certain of these are known as precise load compensation converters, some of these being relatively rapid, or those known as "flash" converters, which are extremely rapid but less precise. The load compensation converters may be precise double ramp converters providing a measuring result on n points at the end of a period 2n times the cycle time of a counting clock contained in these converters. They may be frequency-voltage or frequency-current converters as precise as and twice faster than double ramp converters. They may also be delta modulation converters. All the converters may be preceded by a blocker-sampler so as to memorize the value of the signal over an extremely short period of time and then convert it. Furthermore, it is possible to add to the input of all the converters a Vo polarization signal so as to limit the dynamics from Vo to Vo, plus the signal to be converted.

All the load compensation converters comprise an automatic control or threshold serving to compensate the loads. In all these converters, the signal is either a current or a voltage transformed into a current by a resistor. The total load brought by this current is measured for a given time To. The principle is always the same. The load is accumulated in a capacitor of an integrator and from this capacitor loads of known values are withdrawn, said values being identical or different, withdrawal being effected either continuously or by load packs, or during the time To or after this time To, or during and after this time To. In any event, this amounts to withdrawing loads of known values so as to have at the end of a certain time a nil load in the accumulation capacitor. Thus, the total load brought by the signal to be converted has been transformed into a known number of loads. This number represents a digital measurement of the signal.

In a double ramp converter, loads accumulate for a period To in the capacitor and are continuously withdrawn after To. The discharge time is representative of the measurement of the signal. In a frequency-voltage or frequency-current converter, constant discrete loads are withdrawn during To so that the voltage at the terminals of the capacitor remains extremely low. The extraction frequency of the loads is representative of the measurement of the signal. In delta modulation converters, discrete loads of known identical positive or negative values are fixed frequency injected. The sign of each load is selected so that the voltage at the terminals of the capacitor remains low. These loads are injected during the accumulation time To. The difference between the number of positive loads and the number of negative loads is representative of the measurement of the signal.

There now follows a more precise description of the particular principle of the frequency-voltage or frequency-current converter. This consists of using an analog integrator receiving on an input the sum of the signal to be digitalized, in other words to be quantified, and a certain number of quantization loads of identical values, the polarity of said loads being inverse to that of the signal to be quantified. The average flowrate of the quantization loads is proportional, at an almost residual load, to the amplitude of the signal to be quantified, the injection frequency of these loads being variable and depending on this amplitude.

Counting of the number of the quantified electric loads injected at the input of the integrator is effected as follows. The output of the integrator is connected to the input of a voltage threshold comparator. The output of the threshold comparator is connected to a quantified load generator. When the signal to be quantified is introduced into the integrator, the integrator starts to integrate this signal: the output signal of this integrator evolves with the time involved. When the output of the integrator reaches the threshold of the threshold comparator, this comparator flips and a quantified load is injected at the input of the integrator so as to cause to abruptly vary in the opposite direction the output signal of this integrator. However, the signal to be quantified continues to be introduced at the input of the integrator so that the output signal of the integrator starts again evolving and so that this cycle is reproduced. It is important to mention that this cycle is reproduced at a rhythm which is all the faster when the signal to be quantified itself is high. Thus, the quantization principle is simple: for a given period, a count is made of the number of times it has been necessary to inject quantified electric charges into the integrator. Thus, for example, for a counting period of about one millisecond and by using an injection-integration chain able to admit a cycle of 10 MHz, it is possible, for a maximum amplitude signal, to count up to ten thousand injected loads. This corresponds to a ten thousand points measuring converter. In binary mode, this is roughly equivalent to 14 high order bits.

However, in certain applications and in particular in the envisaged tomodensitometer application, these quantization dynamics are insufficient. In effect, it is necessary to provide a quantization with more precision, for example with from one to one hundred million measurement points. In order to increase precision of the measurement, the fact is used of knowing that at the end of a given period allocated to drawing up a digital value of the signal to be quantified from the number of charges injected into the integrator, the latter retains a non-nil residual charge. This charge is due to integration of the signal during the integration period which succeeded the last injection and which was extended until the end of the given period which corresponds to the end of integration. Finally, quantization of this charge or load makes it possible to increase the dynamics of the converter. In the remainder of this text, the digitalization values obtained from the number of charges injected into the integrator shall be called high order values, and the digitalization values obtained from the residual charge shall be called low order values.

The quantization principle relating to low order values is thus the following: the integrator is discharged by connecting its input to a reference current generator. The period is measured at the end of which the output of this integrator returns to zero. This period is representative of the low order values of the signal. In order to know these values, it is merely sufficient to have function, at the rhythm of a constant step clock, a counter for the period which extends from the start of the discharge until the moment when the output of the integrator returns to zero. Thus, the drawing up of the high order values is effected by a repeated discharge of the integrator, whereas the drawing up of the low order values is effected by measuring the constant current discharge time of the residual charges contained in this integrator at the end of drawing up the high order values. A converter taking account of the residual charge in order to digitalize a signal is described in an article entitled "RESOLVE 22 BITS EASILY WITH CHARGE BALANCE ADCs" by Mr. Thomas J. MEGO and published in the journal called ELECTRONIC DESIGN and dated the 25th June 1987. This converter carries out a charge equipoising type conversion in order to determine the high order values of digitalization. In this converter and for drawing up high order values, a current Io is injected at the input of the converter so as to limit the dynamics to (Ix+Io)/Io, Ix representing the input signal of the converter to be digitalized. Thus, the dynamics are sufficiently reduced so as to use two standard charge values Q/8 and 5 Q/8. These charges are drawn up from a standard resistor R connected between the input of the integrator and a discharge reference potential source Vref by means of a swicth controlled by variable duration voltage pulses. The charge Q/8 is continuously injected and at a constant frequency. It serves to compensate the current Io. As soon as the stored charge becomes too large, the charges Q/8 are replaced by charges 5 Q/8. This stratagem makes it possible to inject at a fixed frequency a charge Q/8 or 5 Q/8 according to the charge equilibrium requirements. The measurement of the number of charges injected provides a high order measurement of the signal. Moreover, in order to draw up the low order values, the residual charge is discharged through another standard resistor connected by means of a switch to the reference potential source, the low order values then being determined from the discharge time.

This type of converter comprises a certain number of drawbacks. In the case of drawing up low order values, the switch being controlled by a fixed frequency discharge oscillator on each voltage pulse, the switch is temporarily closed and the capacitor of the integrator runs down from Q=Vref. T/R. The output voltage variation Vs of the integrator corresponding to this discharge depends on the time constant which the capacitor forms with a standard resistor of the amplitude Vref of the discharge reference potential and the period T during which on each pulse the switch is closed (Vs=Vref. T/R.C).

Now, controlling the closing period of the switch is a delicate problem. In effect, if the maximum conversion period is estimated at one millisecond and ten thousand precision points are required for the measurement, it is therefore necessary to have a pulse cycle of about 10 MHz. It is then easily possible to show that the discharge period, given the fact that it is repeated ten thousand times, shall be adjusted more precisely than the ten thousandth of its elementary period. This amount to stabilizing the conduction period of the switch with this same precision. The fluctuation of the conduction period shall be less than one tenth of a nanosecond. This is difficult to obtain. In the case of drawing up low order values, the residual charge residing in the capacitor of the integrator at the end of quantifying the high order values is low. In order to be able to measure it with sufficient precision, namely finally for a long enough period of time, it is necessary to discharge it with a low current. In order to do this, the capacitor is discharged by the corresponding standard resistor.

Having a regard to the charges which can be accumulated in the integration capacitor and its envisageable size in practice, discharge standard resistors have been selected, said resistors being of about one hundred GIGOHMS. These resistors are very expensive and in no instance may be integrated where this converter is integrated in an MOS type integrated circuit. Finally, the principle is this converter thus requires the precision control of several references: the conduction period of swicthes, the value of the standard resistors and the stability of the reference potential.

SUMMARY OF THE INVENTION

The object of the invention is to overcome these drawbacks by proposing a converter using a frequency-current or frequency-voltage conversion so as to obtain the digitalization high order values and taking account of the residual charge in order to draw up the low order values of this digitalization, but in which the references to be controlled are less numerous. In particular, it is not necessary to define from this the discharge standard resistors and the conduction period of the swicthes is no longer critical. In practice as regards the invention, a discharge (or a charge) of the integration capacitor of the integrator is used through another capacitor, known as a quantization capacitor, connected to a reference potential Vref by means of switches, this potential Vref being fixed for the drawing up of high order values and fixed or variable for the drawing up of low order values.

Accordingly, the object of the invention is to provide a high dynamic analog digital converter of the type comprising means to integrate a signal to be quantified for a given period, these integration means comprising means to accumulate charges originating from the signal to be quantified, means to inject into the accumulation means quantified electric charges in a number proportional to said signal to be quantified, the charges injected being of a polarity opposite the charges originating from the signal to be quantified, counting means known as rough counting means for counting the number of injected quantified charges and calculate from this a high order values quantization of the signal, means to take into account and discharge a residual electric charge accumulated in the accumulation means, counting means, known as fine counting means, in order to count a period corresponding to the discharge of the accumulated residual charge and calculate from this a low order values quantization of the signal, the injection means comprising a first generator of quantified charges and provided with a first charge quantization capacitor, wherein the taking into account and discharge means comprise a second charges generator provided with a second quantization capacitor.

Advantageously, the second quantization capacitor is the same as the first quantization capacitor.

BRIEF DESCRIPTION OF THE DRAWINGS

The invention shall be more readily understood from reading the following description and an examination of the accompanying figures. The latter are given by way of information and are in no way restrictive of the invention. The figures show:

FIG. 1: a diagram of a converter according to the invention;

FIGS. 2a to 2g: examples of temporal diagrams of electric signals used in the converter of the invention;

FIG. 3: an embodiment variation of the invention, more particularly able to be used in digital multimeters.

DETAILED DESCRIPTION OF THE PREFERRED EMBODIMENTS

FIG. 1 represents an analog to digital converter according to the invention making it possible to convert a signal Ix into a digital value. In the remainder of the description, Ix is regarded as being positive. This converter comprises means to integrate a signal Ix during a period To. These integration means are formed by an operational amplifier 5 mounted on the integrator by the reloopig of an integration capacitor 3. This capacitor 3 constitutes the accumulation means of said integration means. In the remainder of the text, the integration means shall be invoked by the integrator. This converter also includes means 1 to inject into the capacitor 3 quantified electric charges. These quantified electric charges are sent in a flow proportional to the amplitude of the signal Ix to be quantified as follows. During a period To after the closing of a switch K1 connected between the signal Ix and the input of the integration means, the signal Ix is introduced at the input 4 of the integrator. Subject to this signal Ix, the integrator 3-5 starts to integrate. The voltage Vs evolves at its output. When this voltage reaches in amplitude a value $-Vo$, a threshold comparator 6 flips and, by means of a set comprising a logical gate 7, a triggered oscillator 8, a control logic 9 and a quantified charges generator 10, activates the injection of quantified charges in the capacitor 3 of the integrator.

FIG. 2a shows the evolution of the voltage Vs at the output of the integrator 3-5 during the period To. The period To is downcounted by a counter 11 of the period To connected firstly to a clock 12 and secondly to a triggering comparator 13. The triggering comparator 13 triggers the counter as soon as it detects the first evolution of the signal Vs on its first return to zero. The start of the period To could also be triggered by a sequencer 23 after an initialization phase, in other words after zeroizing of the integrator and its offset voltage. As shall be seen subsequently on FIG. 2b, the output signal of the triggering comparator passes back through zero once fine counting is ended: it usefully marks the end of counting the low order values, also known as fine counting. FIG. 2c shows the number of strokes produced by the triggered oscillator 8: each stroke corresponds to the injection of a charge. FIG. 2d shows the period during which the output VTo of the counter 11 of the period To validates the functioning of the triggered oscillator 8. In the case of FIG. 1, the counter 11 validates the functioning of the oscillator solely when its output is at the low level.

The functioning of the charge generator (or first charge generator) is the following. During throughout the period To, a switch KR1 connects a reference voltage $-Vref$ to a quantization capacitor 14. On each pulse of the triggered oscillator, the control logic 9 provokes firstly the opening of two switches K5 and K6 which, when closed, short-circuit the capacitor 14 at the ground, and subsequently secondly provoke the closing of two swicthes K3 and K4 which have the effect of placing in series the capacitor 14 between the input of the integrator and the application terminal of the voltage $-Vref$. A quantified charge of a given value equal to C14. Vref is then injected into the capacitor 3. The value C14 represents the capacity of the capacitor 14. This injected charge provokes the abrupt established evolution of the voltage Vs at the output of the integrator 3-5 which varies from $-Vo$ to $-V1 = Vref \cdot C14/C3 - Vo$, C3 representing the capacity of the capacitor 3.

The converter of the invention also comprises a counter 15 which constitutes rough counting means for counting the number of quantified charges thus injected by the charge generator 10 into the capacitor 3. At the end of the period To, the signal at the output of the amplifier 5 may have various voltage values. This residual voltage at the output of the amplifier 5 corresponds to the accumulation of electric charges in the capacitor 3. The quantization of this residual charge constitutes the low order values of the quantified signal corresponding to the signal Ix.

The drawing up of these low order values is obtained by counting the constant current discharge period of the capacitor 3. Taking into account the residual charge requires the opening of the switch K1 and the closing slightly later of a switch K2 connected to the input of the signal Ix upstream of the switch K1 and to a ground. One of the special features of the invention resides in the structure of the means for taking into account and discharge a residual accumulated electric charge. These of course include a charge generator (or second charge generator). This generator has the special feature here of using the quantization capacitor 14. Finally, as long as the capacitor 14 is used to inject in the first phase quantified charges to the input of the integrator to neutralize the effects of the signal Ix, then other constant current charges shall be continued to be injected so as to cancel the voltage at the terminals of the capacitor 3. In order to obtain a quantization of the residual charge, the discharge time Tx (Q=I. Tx) of the capacitor 3 is measured. In one example shown in FIG. 1, this constant current discharge is obtained by opening the switch KR1 and by closing a switch KR2 which subjects the capacitor 14 to a voltage ramp generator 20.

The voltage applied to the terminals of the capacitor 14 then varies linearly with the time involved, since the voltage of the ramp generator 20 evolves linearly. As a result, the discharge current applied to the capacitor 3 is constant. In these conditions, the voltage available at the output of the amplifier 5 evolves linearly towards zero (50a, FIG. 2a).

In this second quantization phase which serves to draw up the low order values, the triggered oscillator 8 is stopped and the control logic 9 is provided so that the switches K3 and K4 are closed, whereas the switches K5 and K6 are open. Organization of the entire quantization is effected under the control of a sequencer 23 which receives the rough end-of-counting signal of the counter 11 of the period To, and which provokes at this moment the flipping of the switches K1 and then K2 (FIGS. 2f and 2g), the flipping of the switches KR1 and then KR2 in order to connect the ramp generator 20, and the starting of a time counter 24. The counter 24 is stopped when the triggering comparator 13 informs the sequencer 23 by means of a gate 25 that the signal Vs has returned to zero. Counting of the counter 24 constitutes all the low order values. For operating reasons, the counter 24 receives, with an order HTx (FIG. 2d) originating from the sequencer 23 a clock signal derived from the clock 12 an ET gate 26. Similarly, a gate 27 and an inverter 28 organize the functioning of the period To counter 11.

The choice of a capacitor 14 in order to discharge the voltage at the terminals of the capacitor 3 avoids having to create a discharge time constant of this capacitor 3 by means of a resistor, which has previously been indicated as being either expensive to produce or impossible to integrate on a semiconductive integrated circuit. At the end of the period To and prior to fine counting, the sequencer 23 provokes the stabilization of the charges stored prior to discharge of the capacitor 3. This period T1 is useful for ensuring separation of the conduction of the switches K1 and K2 and KR1 and KR2.

FIG. 3 shows a variant of the converter of the invention. In this variant, no ramp generator is used which might be difficult to install, for example on a digital multimeter. It would be preferable to use the charge generator 10 (or first charge generator) entirely as a discharge generator (or second charge generator). As a discharge voltage, the same reference voltage is used as the one used during the first phase, namely for the drawing up of the high order values. However, given the fact that by definition the residual charge is low, if care is not taken, then this residual charge of the capacitor 3 would thus be discharged into the capacitor 14. The low order values required would not be obtained. In order to overcome this drawback, a capacitor 30 is installed in parallel with the capacitor 3 connected to it conditionally by a set of switches K8 and K9 respectively connected to a ground and to the input of the integrator. The capacitor 30 has a capacity much higher than that of the capacitor 3. In one example, it is one thousand times higher. With respect to the capacity of the capacitor 3, it is that much higher where more precision is required and thus implies more low order values. The capacitors 3 and 30 constitute the accumulation means of the integration means of the converter.

During the first phase for drawing up the high order values, the switch K8 is closed, whereas the switch K9 is open. As a result, the same output voltage Vs of the operational amplifier 5 is applied firstly to the capacitor 3 and secondly to the capacitor 30. Considering the gain of the operational amplifier 5, this capacitor is also charged and discharged during this first phase as the capacitor 3. At the end of the first phase, the residual charge is represented by the small number of charges stored in the capacitor 3, but with a large number being stored in the capacitor 30. Before the start of the second phase, the switch K8 is opened whilst the switch K9 is closed. Without significantly changing the output voltage of the amplifier 5, the number of charges to be discharged is thus considerably increased by the discharge circuit 10. In these conditions, it is possible to use one and the same circuit 10 as used previously for discharging.

When, in the previous example, the control logic 9 had been neutralized by stopping triggering by means of the gate 7 of the triggered oscillator 8, now is the right time to again authorize the functioning of this triggered oscillator 8. In other words, it is put back into service after the time To and the time T1 required to carry out the switchings of K1, K2, K1' and K7 and stabilize the charges. FIG 2a shows a railing 50b whose steps are due to the successive triggerings of the triggered oscillator 8 during the second counting phase. However, as in the example of FIG. 1, the low order values have been able in one example to be drawn up by the charge counter 15, this also is now the proper time to draw up the low order and high order values by a charge counter 31 connected at the output of the triggered oscillator. A gate OU 32 connected to the output of the gate ET 7 and moreover receiving the signal HTx makes it possible to again authorize the functioning of the triggered oscillator, whilst the sequencer 23 is now disposed so as to provoke the opening and closing of the switches K8, K9 and K'1 and K7 which respectively put into service the capacitor 30 and which switch inputs of the counter 31. When the threshold Vo is not precisely known, the voltage Vs does not strictly return to zero after the withdrawal of a discharge Q. As a result at the end of the period To for counting the charges Q (low order values), the residual charge in the capacitor 3 may be greater than Q. The result of this is that the high order and low order values may not be made to be juxtaposed. They need to be added. In the FIG. 3, the arrow contained in the counter 31 symbolically indicates propagation of the carry over which shall be carried out by counting the low order values.

Thus, the counter 15 and the counter 24 of FIG. 1 may be replaced by a single counter, such as the counter 31 of FIG. 3. If the counting is binary, then the low orders and high orders need to be in a binary ratio: a power n of 2. Thus in a given binary counter, it is possible to count the low order and high order values, subject to entering by means of the switches K'1 and K7 the high order values n stages further than the low order values. At the intersection between the two parts, the measurements of the low order and high order values overlap. In this arrangement, the counter fully contains the sum of the two measurements (low and high order).

The advantage of the two solutions offered in FIGS. 1 and 3 is constituted by the fact of using a given precise element, namely the capacitor 14, so as to define the injected charges, firstly during the first phase, and secondly during the continuous or pulse discharge period of the residual charge. This choice of a given element also provides, independently of the new measurement mode, a homogeneity in the drawing up of the low order and high order values.

In one application using several converters, the counter of To and the sequencer 23 may be common to all the converters. The sequencer then triggers the counting of To for all the converters at the same time following an initialization phase allowing the integrator to be fully discharged and the zeros of the amplifiers and thresholds of the comparators to be calibrated.

The triggered oscillator 8 may be replaced by a monostable device providing a single pulse when the threshold is traversed, and by a monostable device which provokes the discharge of the capacitor 3 where the input current would be greater than the saturation current.

The description given referring to the figures applies to an analog digital current converter. In order to embody an analog digital voltage converter, it merely requires that the voltage signal be transformed into a current signal by adding, for example, an intermediate resistor at the input of the signal to be quantified.

What is claimed is:

1. A high dynamic analog to digital converter, of the type comprising:
   (a) a means to integrate a signal to be quantified during a period, said means capable of accumulating charges originating from the signal to be quantified;
   (b) means to inject into the integration means quantified electric charges in a number proportional to said signal to be quantified, the injected charges being of a polarity inverse to the charges originating from the signal to be quantified, said injection means comprising a quantified charge generator provided with a quantization capacitor, firstly coupled to a reference voltage source of polarity opposite to that of the signal to be quantified;
   (c) fine counting means for counting a period proportional to discharge of the accumulated residual charge and calculate from this a low order value quantization of the signal;
   (d) said quantified charge generator and quantization capacitor, selectably switchable between the first reference voltage source and a ramp generator voltage source of polarity opposite to that of the signal to be quantified;
   (e) rough counting means for counting the number of injected quantified charges and calculate from these a high value quantization of the signal;
   (f) a triggered oscillator and control logic sequencer for alternatively coupling said quantization capacitor with the charge integrator input; and
   (g) a sequencer for alternatively coupling the reference voltage source and ramp generator to said quantization capacitor.

2. A converter as recited in claim 1, wherein the accumulation means comprise a plurality of capacitors, with a first capacitor connected initially to the input of an operational amplifier with integration means, and secondly to the output of said amplifier, and a second capacitor with a capacity greater than that of the first capacitor connected firstly to a constant potential and secondly to the output of said amplifier.

3. A converter as recited in claim 1, wherein the rough counting means and fine counting means comprise a common counter containing a first and a second separate input in order to receive the low and high order value quantizations.

4. A converter as recited in claim 2, wherein the rough counting means and fine counting means comprise a common counter containing a first and a second separate input in order to receive the low and high order value quantizations.

5. A converter as recited in claim 1, wherein the accumulation means comprise a plurality of capacitors, with a first capacitor connected initially to the input of an operational amplifier with integration means, and secondly to the output of said amplifier, and a second capacitor with a capacity greater than that of the first capacitor connected firstly to the input of the amplifier and secondly to the output of said amplifier.

6. A high dynamic analog to digital converter, of the type comprising:
   (a) a means to integrate a plurality of signals to be quantified during a period, said means capable of accumulating charges originating from the signals to be quantified;
   (b) means to inject into the integration means quantified electric charges in a number proportional to said signals to be quantified, the injected charges being of a polarity inverse to the charges originating from the signals to be quantified, said injection means comprising a quantified charge generator provided with a quantization capacitor, firstly coupled to a reference voltage source of polarity opposite to that of the signals to be quantified;
   (c) fine counting means for counting a period proportional to discharge of the accumulated residual charge and calculate from this a low order value quantization of the signals;
   (d) said quantified charge generator and quantization capacitor, selectably switchable between the first reference voltage source and a function generator voltage source of polarity opposite to that of the signal to be quantified;
   (e) rough counting means for counting the number of injected quantified charges and calculate from these a high value quantization of the signals;
   (f) a triggered oscillator and control logic sequencer for alternatively coupling said quantization capacitor with the charge integrator input;
   (g) a sequencer for alternatively coupling the reference voltage source and function generator to said quantization capacitor; and
   (h) a means to selectively measure and discharge a residual electric charge, including said charge generator and appropriately coupled to said quantization capacitor.

7. A converter as recited in claim 6, wherein the accumulation means comprise a plurality of capacitors, with a first capacitor connected initially to the input of an operational amplifier with integration means, and secondly to the output of said amplifier, and a second capacitor with a capacity greater than that of the first capacitor connected firstly to a constant potential and secondly to the output of said amplifier.

8. A converter as recited in claim 6, wherein the rough counting means and fine counting means comprise a common counter containing a first and second separate input in order to receive the low and high order value quantizations.

9. A converter as recited in claim 7, wherein the rough counting means and fine counting means comprise a common counter containing a first and second separate input in order to receive the low and high order value quantizations.

10. A converter as recited in claim 6, wherein the accumulation means comprise a plurality of capacitors, with a first capacitor connected initially to the input of an operation amplifier with integration means, and secondly to the output of said amplifier, and a second capacitor with a capacity greater than that of the first capacitor connected firstly to the input of the amplifier and secondly to the output of said amplifier.

* * * * *